Oct. 6, 1970 J. L. BOYER 3,532,941
PRESSURE-ASSEMBLED SEMICONDUCTOR DEVICE HAVING
A PLURALITY OF SEMICONDUCTOR WAFERS
Filed May 23, 1967 2 Sheets-Sheet 1

INVENTOR.
JOHN L. BOYER
BY
OSTROLENK, FABER, GERB & SOFFEN
ATTORNEYS

INVENTOR.
JOHN L. BOYER

BY

OSTROLENK, FABER, GERB & SOFFEN

ATTORNEYS

United States Patent Office 3,532,941
Patented Oct. 6, 1970

3,532,941

PRESSURE-ASSEMBLED SEMICONDUCTOR DEVICE HAVING A PLURALITY OF SEMI-CONDUCTOR WAFERS

John L. Boyer, El Segundo, Calif., assignor to International Rectifier Corporation, El Segundo, Calif., a corporation of California Filed May 23, 1967, Ser. No. 640,629
Int. Cl. H01l *1/14, 1/16*
U.S. Cl. 317—234 4 Claims

ABSTRACT OF THE DISCLOSURE

Two semiconductor wafers are connected to one another through an intermediate conductive plate, with massive conductive bodies engaging the outer opposite surfaces of the two wafers. Flexible diaphragms hold the massive conductive bodies in position with respect to one another, with the diaphragms connected to one another at their peripheries by a cylindrical insulator. The semiconductor wafers can contain single junctions of identical construction or may be P-N and N-P devices, respectively, so that they can have reduced diameter electrodes adjacent their N-type surfaces while being symmetrically disposed within the housing with the reduced N-type surfaces opposing one another. The wafers may also contain a plurality of junctions to comprise series-connected controlled rectifiers or A-C switching devices.

This invention relates to semiconductor device assemblies, and more particularly relates to a novel arrangement for a pressure-connected semiconductor device assembly having at least two series-connected wafers. The wafers are then arranged between massive conductive bodies in the manner described in my copending application, Ser. No. 624,282, filed Mar. 20, 1967, now Pat. No. 3,452,254, entitled "Pressure Assembled Semiconductor Device Using Massive Flexibly Mounted Terminals," and assigned to the assignee of the present invention, where, however, a plurality of semiconductor wafers are contained between the two massive electrodes. Preferably, the individual semiconductor wafers are separated by a conductive plate which assists in drawing heat away from the individual wafers.

Accordingly, a primary object of this invention is to provide a pressure-assembled semiconductor device assembly which has increased voltage capacity.

Yet another object of this invention is to provide a unitary housing assembly which may be pressure-assembled and which contains a plurality of series-connected semiconductor wafer elements.

These and other objects of this invention will become apparent from the following description when taken in connection with the drawings in which.

Figure 1:
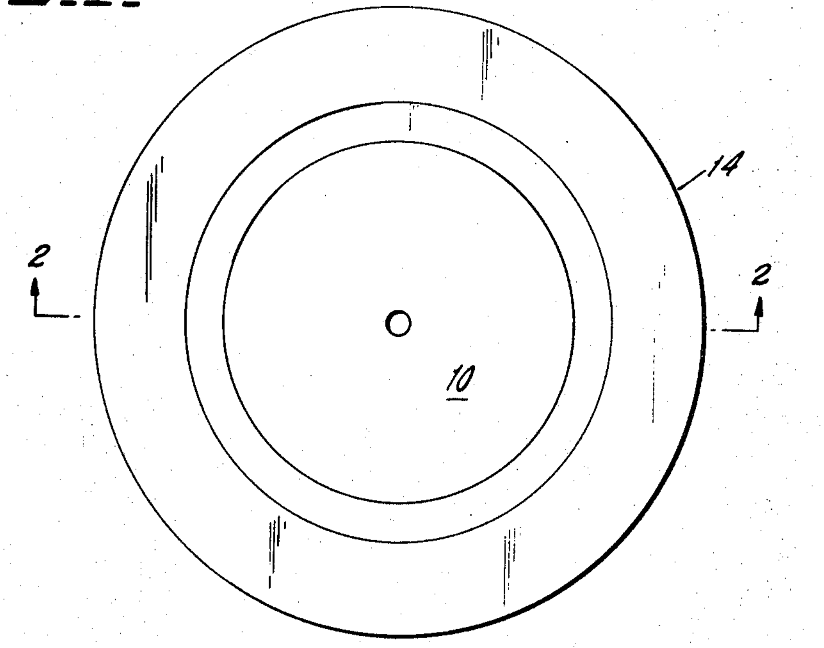
FIG. 1 is a top plan view of the assembly of the present invention.
Figure 2:
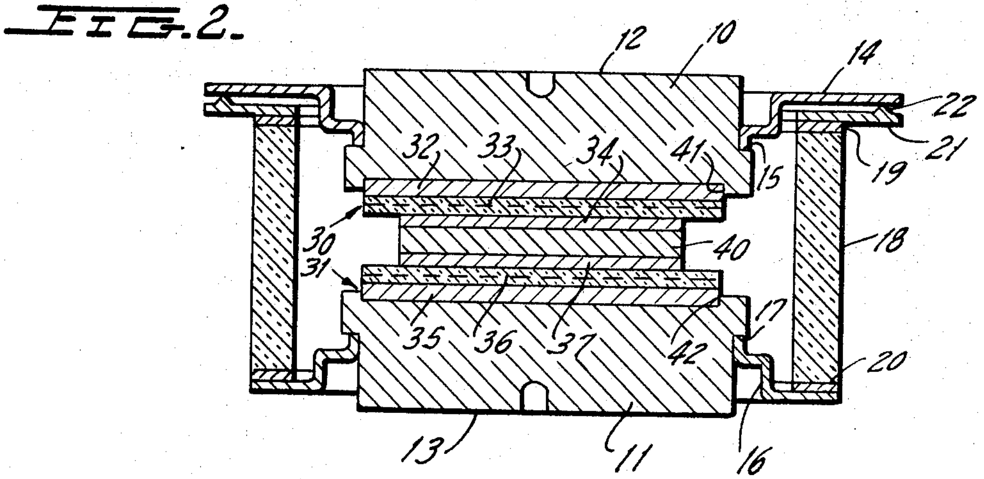
FIG. 2 is a cross-sectional view of FIG. 1 taken across the section line 2—2 in FIG. 1.

Referring first to FIGS. 1 and 2, there is illustrated therein a pressure-bonded assembly which comprises massive upper and lower electrodes 10 and 11 which have flat outer faces 12 and 13, respectively, which can be connected to respective terminals by a suitable clamping structure (not shown). The upper massive electrode 10 has a conductive diaphragm 14 extending therefrom which is connected in shoulder 15 of electrode 10. In a similar manner, a conductive diaphragm 16 is connected to shoulder 17 of electrode 11. The two electrodes 10 and 11 are held with respect to one another by an insulation ring 18 which has conductive end surfaces 19 and 20, which are suitably soldered to welding ring 21 and the header 16, respectively. The welding ring 21 has a peripheral extending portion 22 which is welded to the adjacent end surface of diaphragm 14, whereby diaphragm 14 has a large flexing moment-arm, thereby imparting considerable flexibility to the assembly, including electrodes 10 and 11 and insulation ring 18.

The internal volume inside of insulation ring 18 is a hermetically sealed volume, and contains two semiconductor wafer elements 30 and 31 in accordance with the invention. Element 30 is comprised of a molybdenum expansion plate 32, a semiconductor wafer 33 having a single junction therein, and a second expansion plate 34 which may also be of molybdenum. Plates 32 and 34 may be suitably soldered or otherwise fixed to the semiconductor wafer 33. Device 31 is similarly composed of an expansion plate 35, a semiconductor wafer 36 which contains a junction therein, and expansion plate 37.

The two devices 30 and 31 are, therefore, of identical physical construction, but differ from one another in that the lower region of wafer 36 is of the N-type, while the lower region of wafer 33 is of the P-type. Thus, the two assemblies 30 and 31 are alternately N-P and P-N devices. In this manner, the connection of the two wafers at their smaller diameter expansion plates still places the junctions in electrical series so that they conduct forward current in the same direction and block reverse voltage in the same direction between the electrodes 10 and 11.

In order to improve the heat-removing characteristics of the assembly, a conductive plate 40 is positioned between the two expansion plates 34 and 37. It is to be noted that the dimensions shown in FIG. 2 are somewhat distorted for purposes of clarity and that the conductive plate 40, which may be of copper, may be ten or more times as thick as expansion plates 34 and 37.

Figure 4:
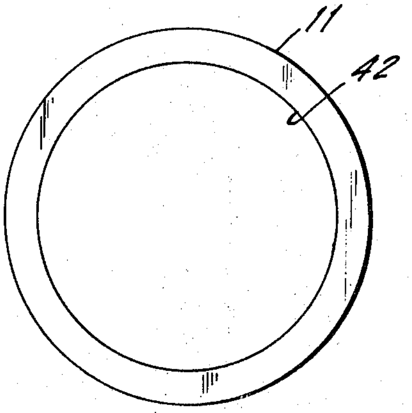
FIG. 4 is a top plan view of the wafer receiving surface of one of the massive electrodes of FIG. 2.

As a further feature of the invention, each of the massive electrodes 10 and 11 are provided with depressed well regions 41 and 42, with well 42 best shown in FIG. 4. Well 42 serves to automatically position the wafer assembly 31 with respect to electrode 11, with well 41 similarly positioning subassembly 30 with respect to electrode 10. If desired, the wells 41 and 42 could be replaced by projections for positioning the wafers.

In assembling the device of FIGS. 1 and 2, the diaphragms 14 and 16 are preassembled to the electrodes 10 and 11, respectively. Insulation cylinder 18 is thereafter soldered to diaphragm 16. The assemblies 30 and 31, with copper plate 40 interposed therebetween, are then stacked atop electrode 11. Thereafter, electrode 10 and its diaphragm 14 are located over the stack and diaphragm 14 is resistance-welded to welded projection 22 on ring 21 which was preassembled to the insulator 18. Preferably, in order to prevent accidental dislocation of the central conductive plate 40, the plate 40 may be previously soldered to either expansion plate 34 or expansion plate 37.

The device can now be assembled in any suitable compression structure which provides compressional forces for biasing electrodes 11 and 12 toward one another, thereby establishing a high-pressure low-resistance electrical path between the electrodes 11 and 12.

Figure 3:
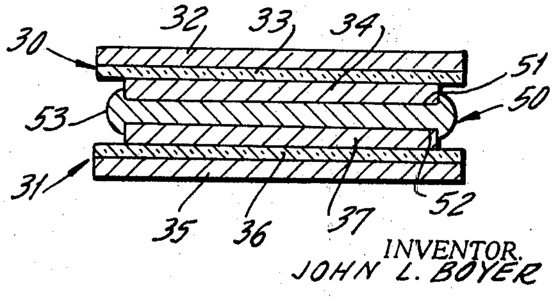
FIG. 3 is a cross-sectional view of an alternate wafer assembly which could be used in FIG. 2.

FIG. 3 illustrates an alternate structure for the plate 40 of FIG. 2, wherein a plate 50 is provided with two wells 51 and 52 on the opposing surfaces thereof for physically locating expansion plates 34 and 37, respectively. Note that the radially extending portion of member 50 has a rounded surface, such as the rounded surface 53, to prevent the formation of high dielectric stresses in the region between the periphery of wafer subassemblies 30 and 31.

Figure 5:
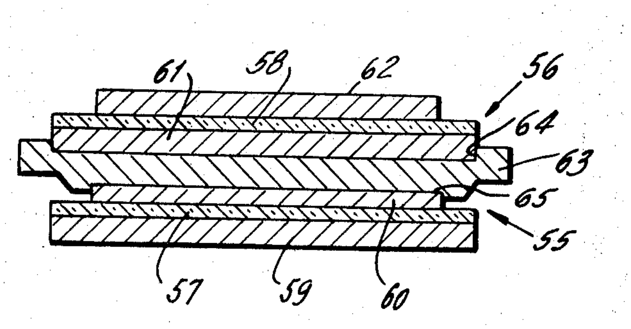
FIG. 5 is a cross-sectional view of a further alternate wafer subassembly which could be used in FIG. 2.

As pointed out previously, the wafers of FIGS. 2 and 3 were respectively P-N and N-P wafers. FIG. 5 illustrates a wafer subassembly arrangement for use in the assembly of FIG. 2 where the two wafers are identical and are both, for example, P-N devices. Referring to FIG. 5, there is illustrated two subassemblies 55 and 56 which are each comprised of identical wafers 57 and 58 having respective molybdenum expansion plates 59–60 and 61–62. The two assemblies are identical in that the lower surfaces of each of the wafers 57 and 58 may be of the P-type while the upper surfaces of each are of the N-type. In order to appropriately locate the wafer assemblies 55 and 56 with respect to one another, the intermediate conductive plate 63 contains an enlarged well 64 having a diameter just larger than the diameter of expansion plate 61, while the opposite surface of plate 63 has a well 65 having a diameter just larger than the diameter of upper expansion plate 60.

Figure 6:
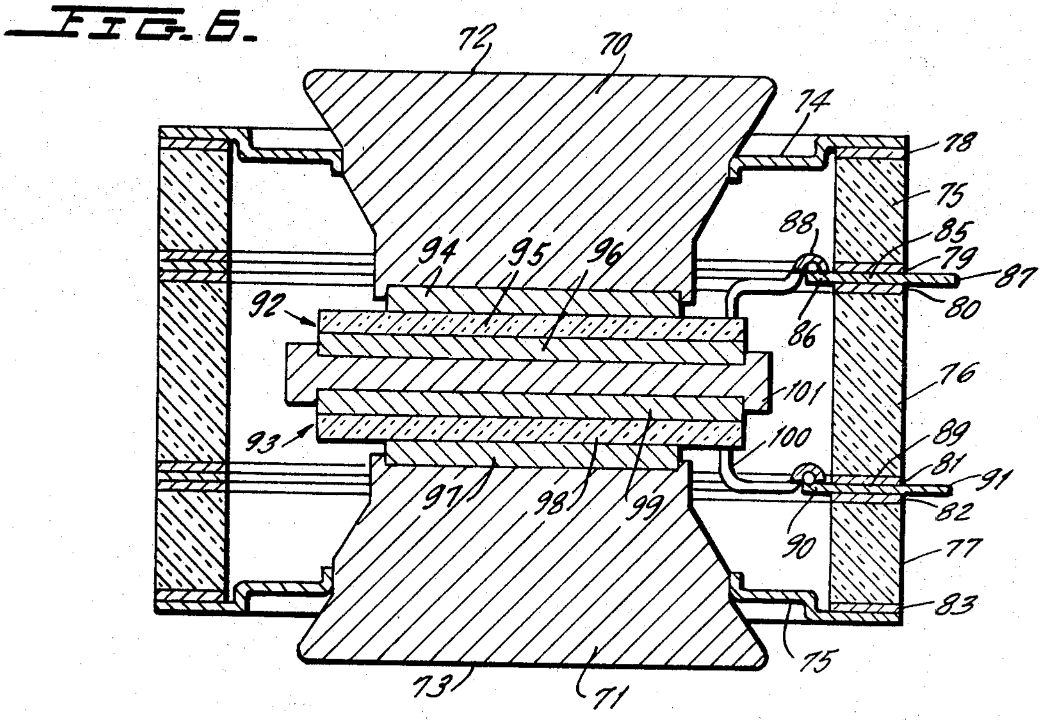
FIG. 6 is a cross-sectional view similar to FIG. 2, illustrating the manner in which controlled rectifier wafers may be contained in a pressure-assembled housing.

FIG. 6 illustrates the manner in which the assembly of FIG. 2 can be modified for the mounting of two series-connected controlled rectifier devices. It will be noted that massive conductive electrodes 70 and 71 have a somewhat different shape than electrodes 10 and 11 of FIG. 2 where, however, the electrodes 70 and 71 still have upper surfaces 72 and 73, respectively, which extend beyond the axial position of their respective diaphragms 74 and 75. The insulation cylinder of FIG. 6 is also modified from that shown in FIG. 2, wherein the insulator is formed of three stacked segments 75, 76 and 77. Each of the segments have metallized end portions 78–79, 80–81 and 82–83, respectively. Metallized portion 78 is then connected to the outer periphery of diaphragm 74, it being noted that a similar attachment could have been used, as illustrated in FIG. 2 using the welding ring 22.

Metallized layers 79 and 80 are then secured to metallic ring 85, which has an internal projection portion 86, for permitting the internal connection to a gate lead 88, and external projection portion 87 for external connection to a gate circuit. In a similar manner, a gate ring 89 is connected between metallized coatings 81 and 82, also having a gate lead connection portion 90, and an external gate circuit connection portion 91. The lower metallized region 83 is then connected to the diaphragm 75.

The interior of the hermetically sealed volume of FIG. 6 contains two controlled rectifier assemblies 92 and 93. Assembly 92 contains a cathode expansion plate 94, a wafer 95 and the anode expansion plate 96. The gate lead 88 extends from the gate region of wafer 95 and is suitably connected to the inwardly extending portion 86 of ring 85. The assembly 93 is composed of a cathode expansion plate 97, a wafer 98, and an anode expansion plate 99. A gate lead 100 then extends from the gate region of wafer 98 and is connected to the internally projecting tongue 90 of ring 89. A conductive plate 101 is then interposed between expansion plates 96 and 99 and may have suitable wafer-locating wells, as illustrated.

In a manner analogous to that described in FIG. 2, the assembly 92 is an NPNP device, whereas the assembly 93 is a PNPN device so that the two devices may be symmetrically arranged, as illustrated, while having the same forward conduction and reverse blocking directions. The total assembly is then electrically bonded by the compressional mounting forces of the mounting structure in which it is inserted (not shown).

The two separate controlled rectifier assemblies are then connected in series and may be simultaneously fired by the connection of appropriate firing pulses to connection regions 87 and 91, which are subsequently connected to the gate leads 88 and 100.

Figure 7:
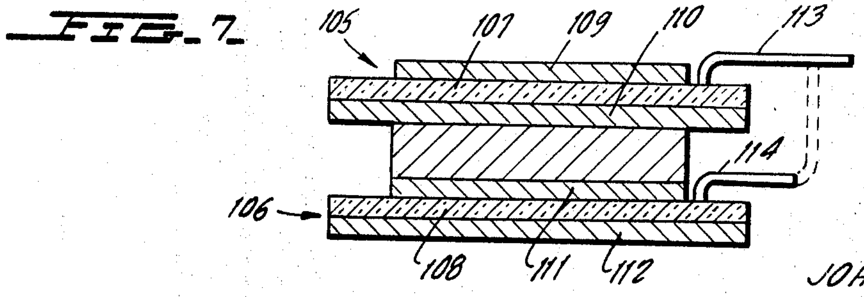
FIG. 7 illustrates a modification of the wafer assembly for use in FIG. 6.

FIG. 7 illustrates a modification for the two controlled rectifier subassemblies 92 and 93 which permits both units to be NPNP devices. Thus, in FIG. 7, two standard controlled rectifier assemblies 105 and 106 are composed of respective semiconductor wafers 107 and 108 and respective expansion plates 109–110 and 111–112. Each of the devices then have gate leads 113 and 114 which, as illustrated in dotted lines, may be connected to one another and subsequently connected to a common gate ring 87 or 91 in FIG. 6. Alternatively, the two gate leads 113 and 114 could be separately connected to the metallic rings 85 and 89, as shown in FIG. 6.

Although this invention has been described with respect to its preferred embodiments, it should be understood that many variations and modification will now be obvious to those skilled in the art, and it is preferred, therefore, that the scope of the invention be limited not by the specific disclosure herein, but only by the appended claims:

The embodiments of the invention in which an exclusive privilege or property is claimed are defined as follows:

1. A pressure assembled semiconductor device housing comprising first and second coaxial massive electrodes having respective flat outer end surfaces and opposing interior faces axially spaced from one another, first and second semiconductor wafers each having first and second expansion plates secured to their opposite surfaces, first and second flexible diaphragms having central openings, a cylindrical insulation ring and a single conductive plate; said first and second flexible diaphragms comprising the sole flexible components of said device; said central openings of said first and second diaphragms respectively connected to the outer periphery of said first and second massive electrodes, respectively, with said flat outer end surfaces of said first and second massive electrodes extending beyond the plane of said first and second diaphragms, respectively; the outer periphery of said first and second diaphragms respectively connected to the opposite ends of said cylindrical insulator, thereby to define a sealed interior volume; said first and second wafers and said conductive plate contained within said interior volume; said first expansions plates of said first and second wafers engaging respective surfaces of said opposing interior surfaces of said first and second massive electrodes; said conductive plate having parallel opposing surfaces respectively directly engaging said second expansion plates of said first and second wafers;

wherein said first expansion plates are each of larger diameter than said second expansion plates; said first wafer having an N-type conductivity region adjacent its said first expansion plate; said second wafer having a P-type conductivity region adjacent its said first expansion plate.

2. The device as set forth in claim 1 wherein at least one of said opposing surfaces of said conductive plate contains expansion plate positioning means extending therefrom.

3. The device as set forth in claim 1 wherein said second expansion plates face one another.

4. The device as set forth in claim 1 wherein said first and second wafers are four-layer devices and each have a gate lead extending therefrom; conductive ring means extending through an axially central portion of said cylindrical insulation ring means; and connection means connecting said gate leads to said conductive ring means.

References Cited

UNITED STATES PATENTS

| | | | |
|---|---|---|---|
| 3,183,407 | 5/1965 | Yasuda et al. | 317—101 |
| 3,238,425 | 3/1966 | Geyer | 317—234 |
| 3,310,716 | 3/1967 | Emeis | 317—234 |
| 3,356,914 | 12/1967 | Whigham et al. | 317—234 |
| 3,447,042 | 5/1969 | Anderson | 317—234 |

FOREIGN PATENTS

| | | |
|---|---|---|
| 72,811 | 4/1960 | France. |
| 1,010,131 | 11/1965 | Great Britain. |
| 1,078,779 | 8/1967 | Great Britain. |
| 1,466,106 | 12/1966 | France. |

R. F. POLISSACK, Assistant Examiner
JOHN HUCKERT, Primary Examiner

U.S. Cl. X.R.

317—235